Figure 1:
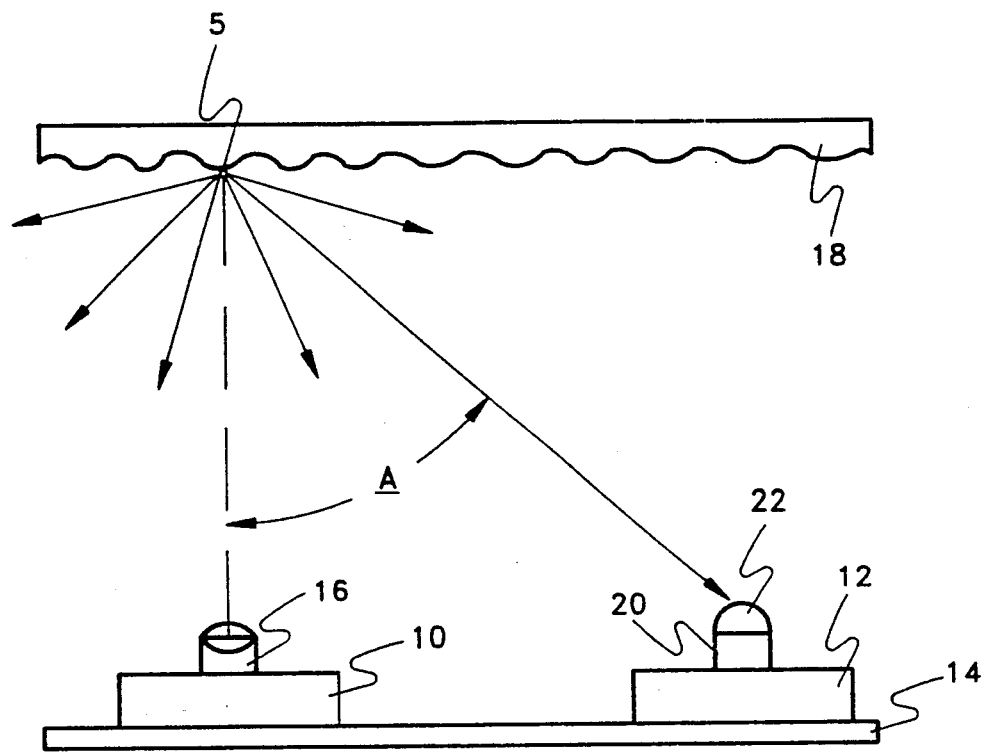

United States Patent [19]
Grieve

[11] Patent Number: 5,151,606
[45] Date of Patent: Sep. 29, 1992

[54] LAMBERTIAN MIRROR OPTICAL

[75] Inventor: Philip G. Grieve, New York, N.Y.

[73] Assignee: Grumman Aerospace Corporation, Bethpage, N.Y.

[21] Appl. No.: 644,930

[22] Filed: Jan. 23, 1991

[51] Int. Cl.$^5$ .............................................. H04B 9/00
[52] U.S. Cl. ...................................... 250/551; 359/127
[58] Field of Search .................... 250/551; 357/17, 19, 357/40; 359/126–129

[56] References Cited

U.S. PATENT DOCUMENTS

| | | | |
|---|---|---|---|
| 3,859,536 | 1/1975 | Thiel | 250/551 |
| 4,054,801 | 10/1977 | Breval et al. | 250/551 |
| 4,112,308 | 9/1978 | Olschewski et al. | 357/19 |
| 4,114,177 | 9/1978 | King | 357/19 |
| 4,124,860 | 11/1978 | Johnson | 250/551 |
| 4,296,331 | 10/1981 | Rodriguez | 250/551 |
| 4,565,924 | 1/1986 | Misumi et al. | 250/551 |
| 4,711,997 | 12/1987 | Miller | 357/19 |
| 4,720,634 | 1/1988 | D'Auria et al. | 359/126 |
| 4,826,274 | 5/1989 | Diamantstein et al. | 359/126 |

*Primary Examiner*—David C. Nelms
*Assistant Examiner*—S. Allen
*Attorney, Agent, or Firm*—William B. Ritchie

[57] ABSTRACT

A method and apparatus for facilitating communication among circuit components mounted on a board, in which the components transmit radiation to a "lambertian" (optically rough) surface located in opposition thereto for detection by the other components. If component identification information is included with each transmission, the present invention allows establishment of dynamically changing interconnections among any of the components on a board. The invention requires a relatively small spatial volume for implementation, and affords large data-transfer rates and freedom from electrical or other interactions.

15 Claims, 1 Drawing Sheet

LAMBERTIAN MIRROR OPTICAL

I. BACKGROUND OF THE INVENTION

A. Field of the Invention

The present invention relates to the provision of interconnections among digital components and, more particularly, to an improved method and means for establishing an optical interconnect network among board-mounted digital devices.

B. Description of the Related Art

A modern electronic computation module or processor typically comprises an array of integrated-circuit ("IC" or "chip") devices mounted on a planar circuit board (which may consist of more than one layer); the board also contains various other electronic components. Metal paths or tracks on the board establish electrical interconnections among the pins or leads of these devices.

Improvements in mask generation techniques have increased the number of electronic components that may be housed in a single IC, leading to so-called "very large scale" integrated circuits ("VLSICs") that can contain many thousands of such components. Naturally, VLSICs usually require more terminal pin connections than less complex devices, and incorporation of multiple VLSICs on a single board therefore increases the density of the necessary interconnection paths.

Unfortunately, limitations associated with ordinary interconnection techniques can restrict the practical number of VLSICs that may be mounted on a single board, thereby limiting the computational power of such a board. Electromagnetic interference between closely spaced connection path can distort signal transmission. Unavoidable capacitances involving these paths can also cause faulty data transfer, particularly at high data-transfer rates. To the extent that these problems can be ameliorated by careful board design, the extended design and testing process, followed by necessary quality-control measures during production, can significantly increase the average cost of highly intricate boards.

Interconnection limitations can also arise at the device level: highly complicated VLSICs may require more terminals for operation than conventional packaging designs can physically support.

Indeed, the very notion of fixed interconnection paths may impede full exploitation of the capabilities offered by complex VLSICs. For example, "parallel" computational designs that include multiple, cooperating VLSIC processors may require selective communications among the processors, thereby demanding overlapping or alternative connections that are either topologically or electrically impracticable using the conventional techniques.

To address these difficulties, various optical interconnection schemes have been proposed. These approaches involve on-chip conversion of electrical output signals into optical signals that are transmitted over some form of "optical interconnect" communication channel to connect one chip to one or more other chips capable of demodulating and decoding these signals. Currently, the most practical mode of light transmission appears to involve optical fiber conduits. These conduits are capable of transmissions at large data-transfer rates without cross-coupling or stray capacitance problems, and they thus can be spaced closely or even overlapped without regard to capacitive or magnetic interaction. Optical fibers can also be manufactured at sufficiently small diameters to significantly increase the number of terminals that may be conveniently associated with a single VLSIC.

Despite its advantages, the optical-fiber solution is far from perfect. Because they cannot be bent into small-radius curves, the optical-fiber interconnections must occupy a relatively large volume, thereby diminishing some of the benefits of device miniaturization. Furthermore, once established, the optical-fiber interconnections are fixed and permanent; consequently, like ordinary interconnections, they cannot be dynamically altered during operation of the associated components.

Another technology presently under development involves data transmission along free-space holographic light beams. Again, even if practical, such techniques would provide a set of fixed (although possibly alterable) interconnection paths, and would also require a large spatial volume due to the long focal lengths generally associated with the necessary optical elements.

Finally, researchers are currently exploring the possibility of using movable on-chip lasers, each capable of scanning through a hemisphere of space, to transmit data by bouncing beams of light off a specular mirror to strike detectors on ICs of interest. While capable of producing dynamically changing interconnects, this technique would require highly refined movement and position-sensing mechanisms, as well as specialized miniature lasers. In addition, each single on-chip laser element would establish only a fixed number of interconnections at a given time. As far as is known, no practical embodiments have as yet been demonstrated.

II. DESCRIPTION OF THE INVENTION

A. Summary of the Invention

The present invention utilizes currently available on-chip light transmission and detection components, coupled with a "lambertian" mirror surface, to facilitate dynamically changing interconnections among any of the components on a board. The invention requires a relatively small spatial volume for implementation, and retains the key advantages—large data-transfer rates and freedom from electrical or other interactions—that characterize optical systems generally. Each chip requires only electrical power connections, thereby significantly reducing the complexity of the circuit board.

The term "lambertian mirror" generally connotes an idealized surface whose emitted or reflected radiance is independent of viewing angle. Herein, however, the term is used more broadly to denote any rough-scattering surface which reflects optical radiation in manner that is largely or substantially invariant with respect to direction.

In operation, all or a selected subset of the ICs on a board are equipped with circuits for converting electrical signals into modulated optical radiation, and the same or other ICs contain detection circuitry for receiving and demodulating these radiation signals and converting them back into electrical signals. The transmission means of each transmitting IC is focused on a single lambertian surface that is preferably disposed in opposition to all of the transmitting and receiving ICs, such that the resulting reflections produced on the surface are visible to the detection means of all of the receiving ICs. Consequently, all of the transmitting chips are potentially "connected" to all of the receiving ICs.

Ordinarily, of course, all chips equipped with transmitters will also have receivers, but this need not be the case. Each transmitter preferably includes a light-emitting diode ("LED") or semiconductor laser whose output radiation is focused through a lens to produce a small spot on the lambertian surface. Because the surface produces a reflection of equal photometric intensity in all directions, the geometric locations of the receiving components with respect to a transmitting component are rendered largely unimportant, so long as the distance between chips is not so great that radiation lost between chips due the inverse-square law reduces the illumination below the detection threshold of any of the receiving chips.

The optical detector used in each receiver can be based on any of a large variety of readily available photosensitive components (such as standard photocells that alter their resistances in response to radiation with a range of wavelengths). Modulation and demodulation circuitry is also well-characterized in the art. Preferably, each detector is surrounded by a wide-angle or "fisheye" lens to present a large effective collection area.

The present invention permits connections to be established between any transmitting IC and any or all of the receiving chips; this provides a critical advantage, for example, in parallel processing computer architectures, where problem-solving efficiency is maximized by dynamic alteration of processor utilization and relationships among processors. Accordingly, because of the large set of potential connections achievable with the present invention, it becomes necessary to specify the particular connections desired for each transmission. One way of accomplishing this is to encode chip-identification information as a preamble to a data transmission as used in computational packet transmission protocols. With this approach, the circuitry of each receiver includes pattern analysis and matching capability to determine whether the chip's identification code accompanies a transmission.

To achieve high data-transfer rates, the transmission and reception circuitry on each chip can be kept separate from the main combinational and logic components, thereby enabling operation of the transmitters and receivers at rates far in excess of typical processor clock frequencies.

It is also necessary to arbitrate among transmitting devices in order to prevent contention problems. One approach utilizes a "party-line" network in which all transmitting chips also contain a receiver, and "listen" prior to sending information to determine whether any other chip is currently transmitting. Alternatively, a time-division multiplex arrangement can be used, wherein the chips are synchronized to a common clock whose pulses are distributed to all chips via a scattered radiation signal emitted by a single chip, with each transmitting chip eligible to transmit during a pre-determined time slot. As a further alternative, the system might employ a frequency-division multiplex method, with each chip configured to transmit and/or receive multiple discrete radiation wavelengths.

B. BRIEF DESCRIPTION OF THE DRAWINGS

The foregoing discussion will be understood more readily from the following detailed description of the invention, when taken in conjunction with the accompanying drawings, in which:

FIG. 1 schematically illustrates the operation of the present invention; and

Figure 2:
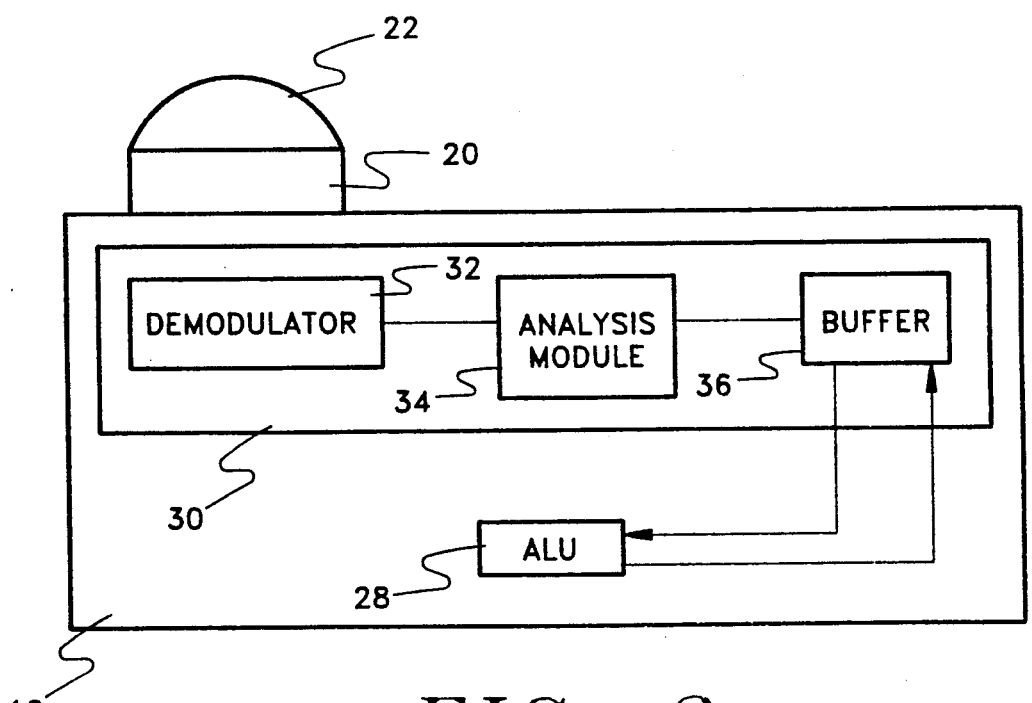

FIG. 2 presents a block diagram of suitable receiving circuitry.

C. DETAILED DESCRIPTION OF THE INVENTION

Refer first to FIG. 1, which schematically depicts the basic components of the present invention and their operation. As shown therein, a transmitting chip 10 and a receiving chip 12 are mounted on a circuit board 14. When sending a signal, transmitting chip 10 emits a beam of optical radiation that is focused through a lens 16 onto a lambertian surface 18, which is oriented in opposition to the transmitting and receiving components. The focal length of lens 16 is chosen such that the beam of radiation produces on lambertian surface 18 a small spot S, which is reflected with largely or substantially equal intensity in all directions therefrom.

Because the optical transmission is capable of operating at very high speeds, the size of the focused spot can limit its bandwidth. If the size of spot S is too large for a given transmission rate, the differing optical paths from spot S to receiving chip 12 will cause time "smearage" of the modulated signal; in other words, chip 12 will "see" different parts of spot S over a period of time that is unduly long for communication with the desired bandwidth. Nonetheless, spot S must be sufficiently bright that the luminous flux reaching all of the receiving chips falls above their detection thresholds.

Another factor limiting the size to which spot S can be reduced is the decrease, proportional to cos $\alpha$, of the flux produced by the radiation at any point on board 14, since the profile of spot S diminishes as the angle $\alpha$ increases. Moreover, because increasing the board-to-surface distance also causes loss of illumination at each detector according to the inverse-square law, the distance between lambertian surface 18 and board 14 is limited not only by desired packaging constraints, but also by the sensitivities of the detectors.

The detector of receiving chip 12 is based on a photodetector 20 that produces an electrical response to impinging radiation of predetermined wavelengths. For example, standard photoresistive detectors that alter their resistances in response to radiation may be advantageously employed, as may photoconductive cells that convert radiation into electrical energy; as noted above, the variety of useful devices is large and well-characterized in the art.

As shown in FIG. 1, photodetector 20 itself is preferably covered by a wide-angle or "fisheye" lens 22 to present large effective collection areas over a wide range of directions. If this feature is omitted, the detector's collection aperture area will be effectively decreased by an amount proportional to the cosine of the angle $\alpha$, since the radiation enters at a grazing angle.

If surface 18 is not lambertian, but rather specular or quasi-specular, Snell's law may to some extent govern the optical behavior of the radiation beam as it impinges on surface 18. Since Snell's law provides that an incident beam is reflected along a specific path (at an angle to the normal equal to the angle of incidence), the effect would be to substantially reduce the intensity of the reflected spot with respect to board positions that deviate from the reflection path. Accordingly, operation of Snell's law would further limit the flux produced at a given board position beyond that already produced by the cosine limitations discussed above.

In order to limit this effect and accommodate utilization of non-lambertian surfaces, the areas of surface 18 on which transmission beams impinge can be shaped into conical "bumps", which preferentially scatter radiation in directions normal to the conical surfaces. Particularly where each transmitting chip 10 transmits its beam along the normal to surface 18, addition of such bumps will significantly increase the amount of radiation available to each receiving chip.

The present invention facilitates establishment of any set of desired connections between each transmitting chip and any or all of the receiving chips. Accordingly, it becomes necessary for the transmitting chip to specify the particular receiving chips that are to accept and decode the transmission. Our preferred technique for establishing the set of desired receiving chips is precede the data portion of a transmission with encoded chip-identification information; each receiving chip is equipped with pattern analysis and matching capability to determine whether a transmission contains its identification code.

For VLSIC microprocessors, the analysis capability can be provided by the existing combinational and logic components. For simpler components, it is necessary to include specialized components to perform these functions. Furthermore, since such specialized components can be "hard-wired" to operate at rates far in excess of typical processor clock frequencies, they can be included as a separate module even in a receiving microprocessor in order to facilitate high-speed communication.

A suitable configuration is shown in the block diagram of FIG. 2. In addition to standard processing circuitry denoted generically as arithmetic and logic unit (ALU) 28, microprocessor 12 contains receiving circuitry shown in block 30. This circuitry includes a demodulator 32, which converts the incoming signals from photodetector 20 into digitized electrical signals; a programmable analyzer 34, which performs the pattern-matching operation between a pre-defined chip identification code and the incoming identification in the signal; and a memory buffer 36. If analyzer 34 detects a match, the remainder of the demodulated transmission (i.e., the data portion) is accepted and stored in buffer 36 for retrieval and processing by ALU 28; if no match is detected, the transmitted data is not accepted.

The dynamic, time-independent nature of the interconnections that may be established with the present invention raises the need to prevent simultaneous transmissions by different chips. If all transmitting chips also contain receiving circuitry 30, it is possible to establish a "party-line" network in which activity of part of the detection circuitry (e.g., photodetector 20 or demodulator 32) inhibits transmission. Because the rate of data transfer can be very large relative to ordinary processing speeds, data can be transmitted in short bursts, thereby leaving sufficient "dead time" for numerous chips to communicate independently without interference or delay.

Alternatively, it is possible to employ a time-division multiple-access arrangement in which each transmitting chip is eligible to send a signal only within a pre-assigned time slot. This approach is most easily implemented by synchronizing all transmitting chips to a common clock, which can be distributed to all chips having detection circuitry by a single IC using the lambertian communication channel. Such a configuration requires initialization of all synchronized components to the common clock frequency, and adjustment for skew caused by differing optical path lengths from the common-clock chip to the different transmitting chips. Synchronization can be accomplished by programming the relevant ICs to initialize on a skipped pulse, and causing the common clock to deliberately omit a pulse at a predetermined time. Because each chip's location is known, the clock can be deskewed by programming the logic circuit of each chip and/or its detection circuitry to adjust for the relevant time lag.

Another approach is to configure each IC's transmission and reception circuitry to transmit and/or receive at multiple alternative wavelengths. The party-line network can then be modified to facilitate repeated scanning through the allowed wavelengths until a currently unused transmission channel is found; with each added wavelength, this technique further reduces the probability of encountering a transmission delay at any particular instant. By adding a sufficient number of transmitted and received wavelengths and equipping each chip with independently operable receivers tuned to each of these wavelengths, the system can be completely multiplexed such that all possible communication paths are generally available.

The terms and expressions which have been employed are used as terms of description and not of limitation, and there is no intention, in the use of such terms and expressions, of excluding any equivalents of the features shown and described or portions thereof, but it is recognized that various modifications are possible within the scope of the invention claimed.

What is claimed is:

1. A method of facilitating communication among a plurality of components disposed in a substantially planar configuration, comprising the steps of:
   a. associating each of first set of components with means for transmitting optical radiation representative of receiver-specific output information of the associated component;
   b. associating each of a second set of components with means for detecting the optical radiation;
   c. selectively operating the transmission means to irradiate, in a manner representative of the output information, a substantially directionally-invariant reflective surface to produce a reflection that impinges on each detection means; and
   d. operating each of the detection means to selectively accept the information.

2. The method of claim 1 wherein the first and second sets are coextensive.

3. The method of claim 1 further comprising the step of synchronizing the transmission means to transmit at different times.

4. The method of claim 2 wherein the each transmission means is operated only when the associated detection means is not detecting.

5. The method of claim 1 wherein transmission and detection among components occurs simultaneously but without interference.

6. The method of claim 5 wherein interference is avoided by causing simultaneous transmissions to take place at different frequencies of optical radiation.

7. The method of claim 1 wherein the detection means accepts information when a portion of the reflections matches a predetermined pattern.

8. Apparatus for facilitating communication among a plurality of components disposed in a substantially planar configuration, comprising:

a. a transmitter coupled to each of a first set of the components for transmitting optical radiation representative of receiver-specific output information of the associated component;
b. a detector associated with each of a second set of the components for detecting the optical radiation;
c. a substantially directionally-invariant reflective surface opposed to the transmitters and detectors;
d. means for selectively operating the transmitters to irradiate the reflective surface in a manner representative of the output information, thereby producing reflections that impinge on the detectors; and
e. means for operating each of the detectors to selectively accept the information.

9. The apparatus of claim 8 wherein each detector includes a wide-angle lens thereover.

10. The apparatus of claim 8 further comprising means for synchronizing the transmitters to facilitate transmission at different times.

11. The apparatus of claim 8 wherein the first and second sets are coextensive.

12. The apparatus of claim 11 further comprising means for inhibiting each transmitter when the associated detector is detecting.

13. The apparatus of claim 8 wherein at least some of the transmitters are capable of transmitting at more than one frequency of optical radiation, and at least some of the detectors are capable of detecting more than one frequency of optical radiation.

14. The apparatus of claim 8 wherein the detectors accept information when a portion of the reflections matches a predetermined pattern.

15. Apparatus for facilitating communication among a plurality of components disposed in two substantially planar configurations, comprising:
a. a transmitter coupled to each of a first set of the components for transmitting optical radiation representative of receiver-specific output information of the associated component;
b. means associated with each of a second set of the components for detecting the optical radiation;
c. a substantially directionally-invariant reflective and translucent surface disposed between the planar configurations;
d. means for operating the transmission means to irradiate the surface in a manner representative of the output information, thereby
  1) producing reflections that impinge on the detection means that lie in the same planar configuration as the transmission means, and
  2) producing a beam that passes through the surface and is scattered to impinge on each of the detection means that lie in the other planar configuration; and
e. means for operating each of the detection means of the second set of components to selectively accept the information.

* * * * *

UNITED STATES PATENT AND TRADEMARK OFFICE
CERTIFICATE OF CORRECTION

PATENT NO. : 5,151,606
DATED : 9/29/92
INVENTOR(S) : PHILIP G. GRIEVE

It is certified that error appears in the above-identified patent and that said Letters Patent is hereby corrected as shown below:

On the title page, item [54] and Col. 1, line 1, should read:

LAMBERTIAN MIRROR OPTICAL INTERCONNECTION OF DIGITAL DEVICES

Signed and Sealed this

Twenty-sixth Day of October, 1993

Attest:

BRUCE LEHMAN

*Attesting Officer*  *Commissioner of Patents and Trademarks*